(12) United States Patent
Joshi

(10) Patent No.: US 7,008,868 B2
(45) Date of Patent: Mar. 7, 2006

(54) PASSIVATION SCHEME FOR BUMPED WAFERS

(75) Inventor: Rajeev Joshi, Cupertino, CA (US)

(73) Assignee: Fairchild Semiconductor Corporation, South Portland, ME (US)

(*) Notice: Subject to any disclaimer, the term of this patent is extended or adjusted under 35 U.S.C. 154(b) by 25 days.

(21) Appl. No.: 10/818,647

(22) Filed: Apr. 5, 2004

(65) Prior Publication Data
US 2004/0241977 A1 Dec. 2, 2004

Related U.S. Application Data

(62) Division of application No. 09/731,226, filed on Dec. 4, 2000, now Pat. No. 6,753,605.

(51) Int. Cl.
*H01L 21/44* (2006.01)
*H01L 21/4763* (2006.01)

(52) U.S. Cl. .................... 438/613; 438/614; 438/618; 438/683

(58) Field of Classification Search ............ 257/737, 257/780, 773, 763; 438/613, 614, 618, 683
See application file for complete search history.

(56) References Cited

U.S. PATENT DOCUMENTS

| | | | |
|---|---|---|---|
| 4,514,751 A * | 4/1985 | Bhattacharya | ............ 257/737 |
| 5,376,584 A | 12/1994 | Agarwala | |
| 5,898,221 A | 4/1999 | Mizuhara et al. | |
| 6,133,634 A | 10/2000 | Joshi | |
| 6,362,087 B1 | 3/2002 | Wang et al. | |
| 6,469,384 B1 | 10/2002 | Joshi | |
| 6,489,678 B1 | 12/2002 | Joshi | |
| 6,566,749 B1 | 5/2003 | Joshi et al. | |
| 6,627,991 B1 | 9/2003 | Joshi | |
| 6,661,082 B1 | 12/2003 | Granada et al. | |
| 6,683,375 B1 | 1/2004 | Joshi et al. | |
| 6,696,321 B1 | 2/2004 | Joshi | |
| 6,720,642 B1 | 4/2004 | Joshi et al. | |
| 6,731,003 B1 | 5/2004 | Joshi et al. | |
| 6,740,541 B1 | 5/2004 | Rajeev | |
| 6,753,605 B1 | 6/2004 | Joshi et al. | |
| 6,798,044 B1 | 9/2004 | Joshi et al. | |
| 6,806,580 B1 | 10/2004 | Joshi et al. | |
| 6,836,023 B1 | 12/2004 | Joshi et al. | |
| 2002/0000665 A1 * | 1/2002 | Barr et al. | ............ 257/758 |
| 2002/0066950 A1 | 6/2002 | Joshi | |
| 2003/0011005 A1 | 1/2003 | Joshi | |
| 2003/0042403 A1 | 3/2003 | Joshi | |
| 2003/0075786 A1 | 4/2003 | Joshi et al. | |
| 2003/0107126 A1 | 6/2003 | Joshi | |
| 2003/0122247 A1 | 7/2003 | Joshi | |
| 2004/0041242 A1 | 3/2004 | Joshi | |
| 2004/0056364 A1 | 3/2004 | Joshi et al. | |
| 2004/0125573 A1 | 7/2004 | Joshi et al. | |
| 2004/0137724 A1 | 7/2004 | Joshi et al. | |
| 2004/0159939 A1 | 8/2004 | Joshi | |
| 2004/0164386 A1 | 8/2004 | Joshi | |
| 2004/0201086 A1 | 10/2004 | Joshi | |
| 2004/0241977 A1 | 12/2004 | Joshi | |

* cited by examiner

*Primary Examiner*—Amir Zarabian
*Assistant Examiner*—Kiesha Rose
(74) *Attorney, Agent, or Firm*—Townsend and Townsend and Crew LLP

(57) ABSTRACT

A bumped wafer for use in making a chip device. The bumped wafer includes two titanium layers sputtered alternatingly with two copper layers over a non-passivated die. The bumped wafer further includes under bump material under solder bumps contained thereon.

6 Claims, 2 Drawing Sheets

PASSIVATION SCHEME FOR BUMPED WAFERS

CROSS REFERENCE TO RELATED APPLICATIONS

This application is a divisional of and claims the benefit of U.S. patent application Ser. No. 09/731,226 filed Dec. 4, 2000 now U.S. Pat. No. 6,753,605, which is herein incorporated by reference in its entirety for all purposes.

BACKGROUND OF THE INVENTION

1. Field of the Invention

The present invention relates to bumped wafers for chip devices, and more particularly, to a new passivation scheme for bumped wafers.

2. Description of the Prior Art

The primary component of today's chip devices is at least one die. The die generally consists of a wafer that has been passivated. The passivation process for today's wafers generally include masking steps and an expensive planarization process.

Because of the masking layers, the metal layer(s) is generally thinner. In a MOSFET device, a passivation layer is placed over the metal layer to protect it. This can result in an increased resistance from the drain to the source region when the chip device is on. Conventional passivation methods include using silicon nitride as a passivation layer. However, as noted, such use can result in extra steps and increased processing expanse in wafer manufacture.

SUMMARY OF THE INVENTION

The present invention provides a bumped wafer that includes two titanium layers sputtered alternatingly with two copper layers over a non-passivated die. Presently, the bumped wafer includes under bump material under the solder bumps contained thereon.

The present invention also provides a method of making the bumped wafer. The method includes providing a non-passivated die and alternatingly sputtering titanium, copper and titanium and copper thereon. A photo process is then performed and an isolation etch is performed in order to remove the top copper layer, the second titanium layer and the bottom copper layer at the isolation location. A photo process is then once again performed in order to create an area for the under bump material that is under the solder bumps. The top layers of copper and titanium are then etched away at the locations on the wafer where the solder bumps will be placed. The under bump material is then deposited thereon and the solder is placed over the under bump material. The photo resist material is then stripped away and the bottom layer of titanium is etched at the isolation locations. The remaining top layer of the copper is then etched away and the solder is reflowed in order to shape the solder into a substantially "ball" shape.

Thus, the present invention provides a bumped wafer and a method of manufacture thereof wherein the bumped wafer includes a titanium passivation layer. The titanium tends to passive itself and adhere well to copper as well as aluminum thereby forming a good interlayer. Solder does not wet to the titanium layer, thus providing for defined solderable surfaces in a wafer. Additionally, the copper interlayers (over the aluminum) offer a solderable surface that can be plated and/or sputtered.

Other features and advantages of the present invention will be understood upon reading and understanding the detailed description of the preferred exemplary embodiments, found hereinbelow in conjunction with reference to the drawings in which like numerals represent like elements.

DETAILED DESCRIPTION OF THE PREFERRED EXEMPLARY EMBODIMENTS

Figure 1A:
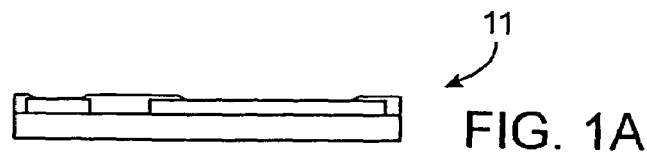
FIGS. 1A–1K illustrate a bumped wafer in various stages of manufacture in accordance with the present invention.
Figure 1B:
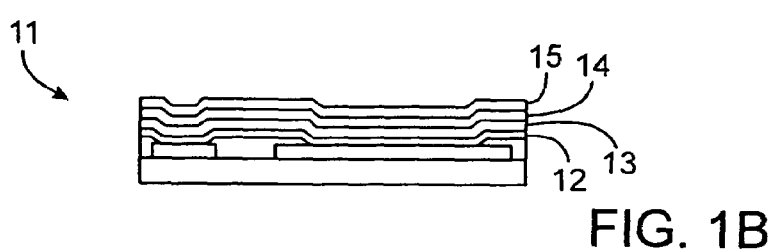
Figure 1C:
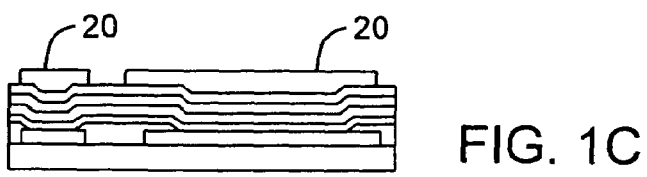
Figure 1D:
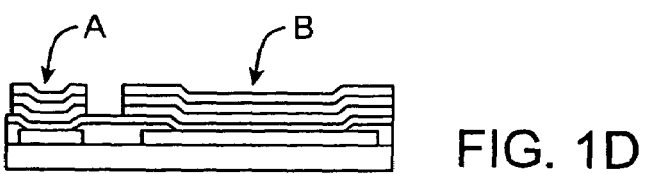
Figure 1E:
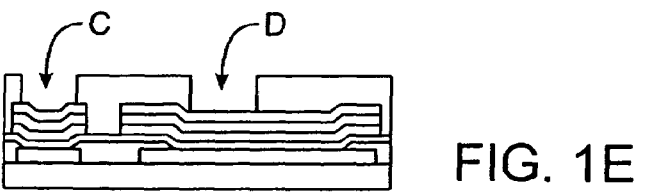
Figure 1F:
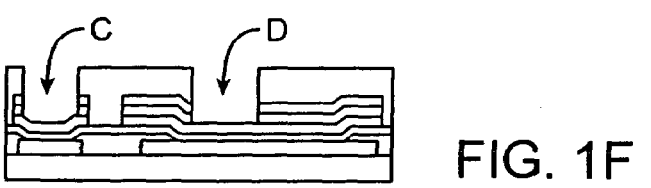
Figure 1G:
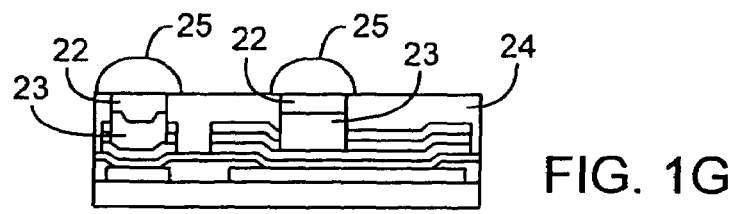
Figure 1H:
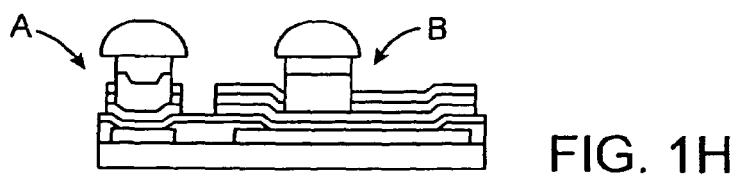
Figure 1I:
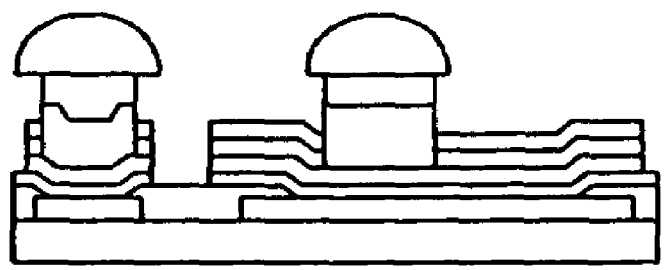
Figure 1J:
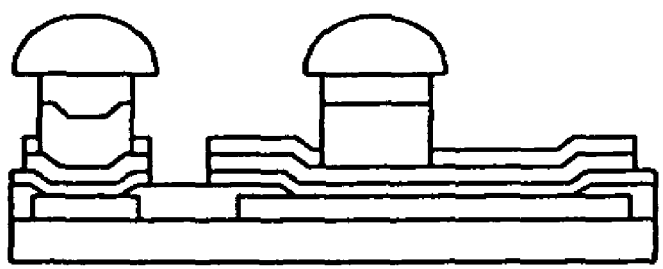
Figure 1K:
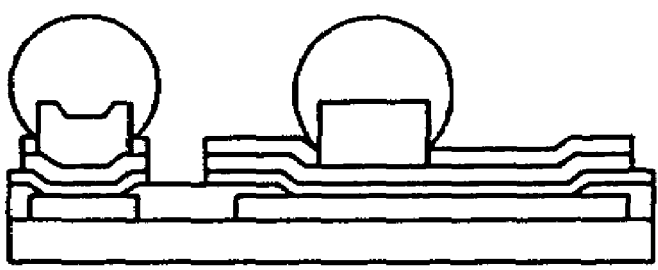

FIG. 1K schematically illustrates a bumped wafer 10 in accordance with the present invention. The bumped wafer includes a non-passivated die and various layers of material deposited thereon. Additionally, the bumped wafer includes solder bumps.

Turning to FIG. 1A, a non-passivated die 11 is illustrated. FIG. 1B illustrates the non-passivated die with a first layer of titanium 12 sputtered thereon, a first layer of copper 13 sputtered on the first layer of titanium, a second layer of titanium 14 sputtered on the first layer of copper, and a second layer of copper 15 sputtered on the second layer of titanium.

Turning to FIG. 1C, a photo resist material 20 is placed over the second layer of copper for isolation purposes. FIG. 1D illustrates the etching away of the photo resist layer along with the second layer of copper, the second layer of titanium and the first layer of copper between region A and region B that are to be isolated. Photo resist material 21 is then placed on the die in such a manner that region C and region D are exposed as can be seen in FIG. 1E. As illustrated in FIG. 1F, the second layers of copper and titanium are then etched from regions C and D.

Turning to FIG. 1G, solder 22 is plated in regions C and D with an amount of copper as layer 23. A photoresist layer 24 is provided and solder bumps 25 are placed over solder 22.

As can be seen in FIG. 1H, the photo resist is then stripped away from regions A and B. The first layer of titanium is then etched out of the isolation area as can be seen in FIG. 1I. As can be seen in FIG. 1J, the second layer of copper is then etched from the regions A and B and the solder is reflowed so that the solder takes on a substantially "ball" shape as can be seen in FIG. 1K Thus, the present invention provides a bumped wafer for use in a chip device. For example, the bumped wafer may be formed to provide MOSFETs in the chip device. The copper interlayers are over the aluminum of the non-passivated die and offer a solderable surface that can be plated or sputtered. The copper has a higher conductivity (thermal and electrical) when compared to aluminum and additionally, thicker copper layers are easier to fabricate in comparison to thicker aluminum layers. Use of the titanium as a passivation layer eliminates the need for using silicon nitride or other conventional passivation methods. The titanium tends to passivate itself and adheres well to copper as well as aluminum forming a good interlayer. The thick copper layer on the aluminum layer reduces $R_{ds}$-on.

Those skilled in the art will understand that the wafer may be manufactured without solder bumps. The solder bumps would then be added later during the manufacturing process of the chip device.

Although the invention has been described with reference to specific exemplary embodiments, it will appreciated that

What is claimed is:

1. A method of making a bumped wafer, the method comprising:
   providing a non-passivated die;
   alternatingly sputtering a first titanium layer, a first copper layer, a second titanium layer and a second copper layer onto the die;
   depositing photo resist material onto the second copper layer;
   etching isolation areas thereby removing the photo resist material, the second copper layer, the second titanium layer and the first copper layer at the isolation areas;
   depositing photo resist material to define bump locations;
   etching at bump locations thereby removing portions of the second copper layer and the second titanium layer at the bump locations;
   depositing under-bump material at the bump locations;
   depositing solder on the under-bump material;
   removing the photo resist material;
   etching the second titanium layer at the isolation locations;
   etching the second copper layer; and
   reflowing the solder.

2. A method comprising:
   providing a non-passivated die;
   forming a first titanium layer at non-isolation locations on the die;
   forming a first copper layer directly on the first titanium layer;
   forming a second titanium layer directly on the first copper layer at non-solder bump locations;
   forming a second copper layer on the second titanium layer;
   etching the second copper layer, the second titanium layer, and the first copper layer at a first location; and
   etching the second copper layer and the second titanium layer at a second location.

3. The method of claim 2 further comprising forming a copper structure and a solder bump at the second location.

4. A method comprising:
   providing a non-passivated die;
   forming a first titanium layer on the non-passivated die;
   forming a copper layer directly on the first titanium layer;
   forming a second titanium layer directly on the copper layer, wherein the second titanium layer includes an aperture;
   forming a copper structure within the aperture of the second titanium layer; and
   forming a solder structure over the copper structure.

5. The method of claim 4 wherein the solder structure is a solder ball.

6. The method of claim 4 wherein the first titanium layer, the copper layer, the second titanium layer, the copper structure, and the solder structure are at non-isolation locations of the non-passivated die.

* * * * *